United States Patent [19]

Stroms

[11] Patent Number: 4,872,381
[45] Date of Patent: Oct. 10, 1989

[54] PROGRAMMABLE MAGNETIC REPULSION PUNCHING APPARATUS

[75] Inventor: Karl F. Stroms, Wappingers Falls, N.Y.

[73] Assignee: International Business Machines Corp., Armonk, N.Y.

[21] Appl. No.: 218,186

[22] Filed: Jul. 13, 1988

[51] Int. Cl.$^4$ ............................................. B26D 7/18
[52] U.S. Cl. ..................... 83/76.1; 83/100; 83/171; 83/169; 83/365; 83/367; 83/552; 83/575
[58] Field of Search ................. 83/170, 171, 365, 367, 83/552, 100

[56] References Cited

U.S. PATENT DOCUMENTS

| | | | |
|---|---|---|---|
| 3,351,740 | 11/1967 | Heuer | 83/365 |
| 3,695,130 | 10/1972 | Fedrigo | 83/13 |
| 3,730,039 | 5/1973 | Fedrigo | 83/575 |
| 3,822,622 | 7/1974 | Smith et al. | 83/100 |
| 4,209,129 | 6/1988 | Haas et al. | 83/171 |
| 4,425,829 | 1/1984 | Kranik et al. | 83/62.1 |

FOREIGN PATENT DOCUMENTS 615573 2/1961 Canada .

OTHER PUBLICATIONS

IBM Technical Disclosure Bulletin, vol. 13, No. 4, Feb. 13, 1971, p. 2536.
IBM Technical Disclosure Bulletin, vol. 16, No. 12, May 1974, p. 3933.
IBM Technical Disclosure Bulletin, vol. 20, No. 4, Sep. 1977, p. 1379.
U.S. patent application Ser. No. 837,933, filed Mar. 10, 1986.

Primary Examiner—Frank T. Yost
Assistant Examiner—Thomas Hamill, Jr.
Attorney, Agent, or Firm—Ira David Blecker

[57] ABSTRACT

A punch apparatus for punching hole patterns in thin sheet material. The apparatus includes a housing having a liquid-cooled cavity therein; a coil mounted in the liquid-cooled cavity; a driver disk made of a highly conductive material mounted in the liquid-cooled cavity, the driver disk mounted adjacent to the coil; a driver button located outside of the liquid-cooled cavity but in communication with the driver disk; and a punch element for perforating thin sheet material aligned with the driver button. Finally, the apparatus includes an electrical source for energizing the coil with a pulse of electrical energy for generating flux linking the driver disk and the coil to repel the driver disk from the coil, thereby translating the driver button and the punch element, causing the punch element to perforate a thin sheet of material.

14 Claims, 6 Drawing Sheets

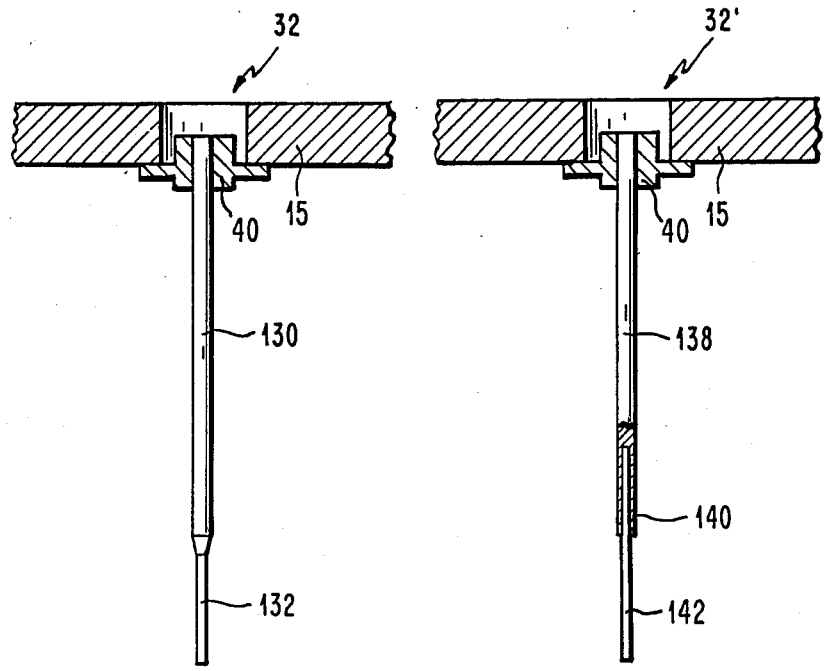
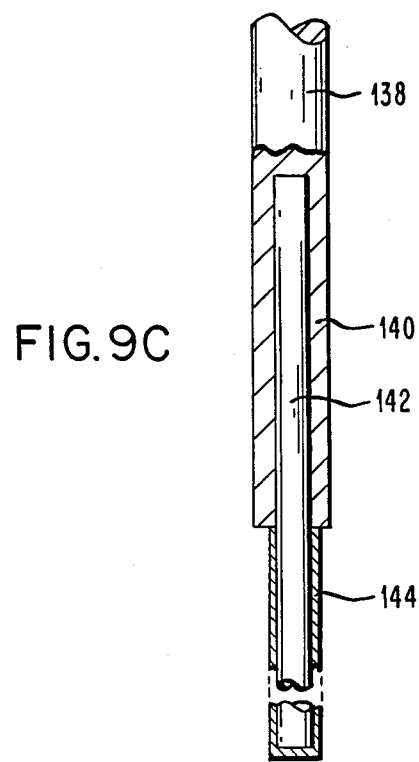
FIG. 9A  FIG. 9B
FIG. 9C

PROGRAMMABLE MAGNETIC REPULSION PUNCHING APPARATUS

TECHNICAL FIELD

This invention relates to punch apparatus for punching very small holes in thin sheet material, and more particularly, to an improved programmable punch apparatus for forming holes in thin sheet material such as green ceramic sheet.

Description of Prior Art

In the manufacture of multilayer ceramic (MLC) substrates for integrated circuit semiconductor package structures, a plurality of green ceramic sheets is formed by doctor blading a slurry containing a resin binder, a particulate ceramic material, solvents, and a plasticizer, drying the doctor bladed sheet and cutting it into appropriate sized sheets. Via holes are then punched for forming electrical interconnections through the sheet. Electrically conductive paste is deposited in the holes, and in appropriate patterns on the surface of the sheets, the sheets stacked and laminated, and the assembly subsequently fred at a sintering temperature. Punching the via holes in ceramic sheets presents formidable engineering problems in view of their small size and density and the complex hole patterns needed. It is conventional to punch via holes with apparatus of the type disclosed in IBM Technical Disclosure Bulletin Vol. 13, No. 4, Feb. 13, 1971, p. 2536 or IBM TDB Vol. 16, No. 12, May 1974, p. 3933 and U.S. Pat. No. 4,425,829, the disclosures of which are incorporated by reference herein. In these apparatus a plurality of punch elements arranged in the grid on a punch head are indexed over the green sheet which is covered by interposer mask. The interposer mask contains openings where holes are desired to be punched. When the punch elements contact the interposer mask as the punch head is moved downwardly a hole will be punched where the openings occur since the punch element will pass through the openings in the interposer mask, and through ceramic green sheet. In other areas covered by the interposer mask, i.e. where holes are not desired, the interposer mask will cause the punch element to be retracted into the head.

Automated punch apparatus which utilize individually programmable punches have been suggested in IBM Technical Disclosure Bulletin Vol. 20, No. 4, Sept. 1977, p. 1379, the disclosure of which is incorporated by reference herein. This type of punching apparatus does not require the aforedescribed interposer mask, since the individual punching elements can be activated electrically upon command. In this apparatus, as in the punch apparatus that uses an interposer mask, a punch head is used which includes punch elements for each sector of the sheet to be punched. A punch head can have as many as 100 individual punch elements. In the programmable punch head, selected punches are extended with a solenoid and the entire head moved downwardly as a unit to punch the holes. The punches that have been moved into extended positions punch holes in the sheet. The others in retracted positions do not penetrate the sheets and therefor do not form holes. The support for the green sheet must stop during the punching stroke in order to avoid breaking the punch elements. In addition the general overall geometry of the hole pattern is dictated by the geometry of the punch head. The punch hole pattern cannot be conveniently expanded or contracted even through the hole pattern can be changed.

A high velocity punch that uses a magneto repulsive actuator for driving a punch element through a workpiece is shown in U.S. Pat. Nos. 3,695,130 and 3,730,039, the disclosures of which are incorporated by reference herein.

More recently, a programmable punch apparatus has been disclosed in U.S. patent application Ser. No. 837,933 filed Mar. 10, 1986, the disclosure of which is incorporated by reference herein. In this reference, magnetic repulsion is utilized to drive a punch through thin sheet material. While this programmable punch apparatus represents a major advance in the art of punching, it nevertheless suffers from the limitation that the punch element may become heated to such a degree that the efficiency of the punch apparatus is adversely effected.

Accordingly, it is an object of the invention to have an improved programmable punching apparatus wherein the disadvantages and limitations cf the prior art have been overcome.

This and other objects of the invention will become more apparent after referring to the following description considered in conjunction with &he accompanying drawings.

BRIEF SUMMARY OF THE INVENTION

The objects of the invention have been achieved by providing a punch apparatus for punching hole patterns in thin sheet material. The apparatus comprises a housing having a liquid-cooled cavity therein; a coil mounted in the liquid-cooled cavity; a driver disk made of a highly conductive material mounted in the liquid-cooled cavity, the driver disk mounted adjacent to the coil; a driver button located outside of the liquid-cooled cavity but in communication with the driver disk; and a punch element for perforating thin sheet material aligned with the driver button. Finally, the apparatus comprises a means for energizing the coil with a pulse of electrical energy for generating flux linking the driver disk and the coil to repel the driver disk from the coil, thereby translating the driver button and the punch element, causing the punch element to perforate a thin sheet of material.

BRIEF DESCRIPTION OF THE DRAWINGS

FIGS. 9A and 9B are partial cross-sectional views of a presently used punch element and a punch element according to the invention, respectively, and FIG. 9C is an enlarged cross-sectional view of the tip of the punch element shown in FIG. 9B.

BEST MODE FOR CARRYING OUT THE INVENTION

Figure 1:
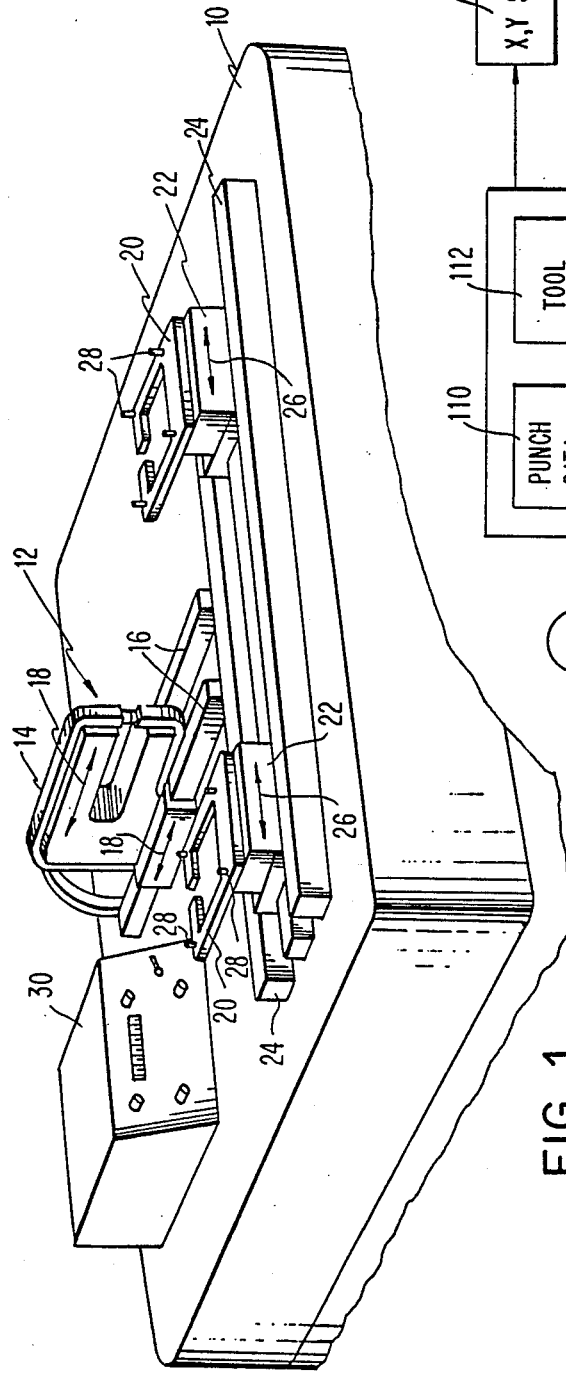
FIG. 1 is a perspective view of the overall apparatus of the invention illustrating the general relationship between the punch apparatus and the support for the sheet material.

Referring now to the drawings in more detail, there is illustrated a punch apparatus of the invention. As shown in FIG. 1, a bench or table 10 supports the punch apparatus 12, which includes a punch 14 mounted for movement on rail 16 in the direction indicated by arrow 18, and a sheet workpiece support 20 mounted on carriage 22, in turn mounted on rails 24 for movement in the directions indicated by arrow 26. Preferably two sheet support elements 20 are provided, both of which are mounted for support on rails 24. Suitable alignment pins 28 are provided on sheet support 20 to hold a sheet to be punched that is provided with alignment holes. The control panel 30 is provided with suitable controls to operate the punch apparatus 12.

Figure 2:
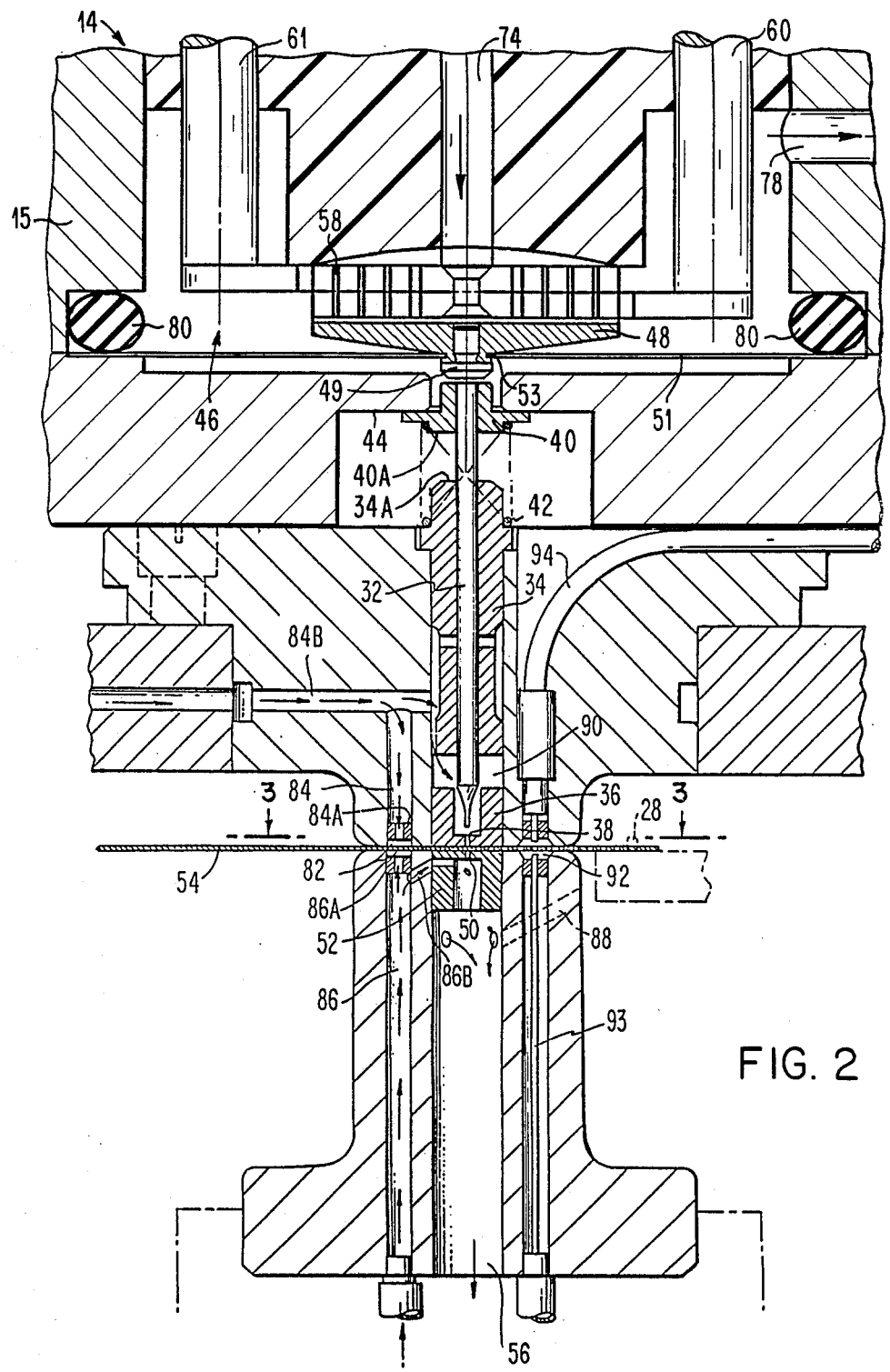
FIG. 2 is a cross-sectional view of the punch apparatus of the invention illustrating the elements thereof.

Referring now to FIG. 2 of the drawings, there is illustrated the detailed structure of punch 14 having a housing, generally indicated by 15. A punch element 32 is mounted for rectilinear movement on bushing 34 and punch guide block 36, with the punch element end of reduced diameter aligned with hole 38 in block 36. The end of punch element 32 is withdrawn from hole 38 when it is in a retracted position as indicated in FIG. 2. Collar 40 is mounted on the upper end of punch element 32. Spring 42 seated on abutment surfaces on bushing 34 and collar 40 support the weight of the punch element and attached elements to urge it into contact with an abutment surface 44 of housing 15. The lower end of punch 32 is aligned with hole 50 in punch die 52. When the punch element 32 is translated downwardly, the lower end will penetrate the workpiece sheet 54, form a hole, and the end of the punch element 32 enter hole 50 in punch die 52. The punched out material, i.e. the slug, will fall downwardly into chamber 56.

The punch element 32 is driven through the workpiece sheet 54 by magneto repulsion. A planar high energy coil 58 is mounted within liquid-cooled cavity 46 of housing 15. Also mounted in the liquid-cooled cavity 46 is driver disk 48 of highly (electrically) conductive material. The driver disk 48 is mounted adjacent to, in close proximity to and coaxially with coil 58. Located outside of liquid-cooled cavity 46 is driver button 49 which is in coaxial alignment with driver disk 48. While driver button 49 is located outside of liquid-cooled cavity 46, by means to be discussed hereafter, the driver button 49 nevertheless communicates with driver disk 48. The punch element 32 is coaxially aligned with driver button 49.

An important element of the present invention is resilient diaphragm 51 which is positioned between the driver disk 48 and the driver button 49 but allows communication between driver disk 48 and the driver button 49. As is apparent resilient diaphragm 51 defines an outer boundary of the liquid-cooled cavity 46. Resilient diaphragm 51, however, is more than a sealing member. During the magnetic repulsion of driver disk 48, to be discussed in more detail hereafter, resilient diaphragm 51 is deformed downwardly as driver button 49 drives punch element 32 downwardly. On the return stroke, resilient diaphragm 51 returns to its undeformed position. Thus, it is an important requirement of resilient diaphragm 51 that it must be able to seal while undergoing repeated deformation.

It is expected that many materials will be suitable for resilient diaphragm 51. Among these materials are, by way of illustration and not limitation, stainless steel, rubber, fiberglass or other polymeric material, while the presently preferred material is stainless steel.

As mentioned previously, driver button 49 communicates with driver disk 48. A particularly preferred arrangement for carrying out this relationship is to first place a portion of driver disk 48 through an aperture 53 in resilient diaphragm 51. Thereafter, driver button 49 is force fitted into driver disk 48, thereby causing plastic flow of driver disk 48 around aperture 53 which serves to seal aperture 53.

Leads 60 and 61 are connected to a suitable source of electric current. The current going through coil 58 produces a magnetic field that links with the driver disk 48 inducing a current that is substantially of opposite phase with the current flowing through the coil 58. This current in the disk 48 produces a magnetic field which opposes the field in coil 58. A force results from the two opposing magnetic fields which drives the disk 48 away from fixed coil 58. The force is proportional to the number of turns in coil 58, the time varying currents in the coil and disk as well as other physical parameters of the system. In the preferred embodiment a force of approximately 30 pounds is generated. This high force combined with a low moving mass yield a very high speed punch drive system. The movement of punch element 32 is terminated when the surface 40A of collar 40 strikes the surface 34A of bushing 34 and is rebounded. The pulse of electrical current passed through coil 58 is of a magnitude to produce a very rapid acceleration of the punch element 32 away from coil 58.

Compared to the punching apparatus of the previously mentioned U.S. patent application Ser. No. 837,933, the speed of the present punch apparatus is believed to be much greater. It is expected that a hole could be punched in about 100 micro seconds or less. This conclusion is based on the fact that the present punch element has half the mass and double the acceleration of the prior punch element. Too, the present driver disk is cooled and is closer to the coil—both factors indicating that an increase in speed will result. The present punch element also has high return velocity. The high return velocity is achieved by the rebounding of collar 40 on bushing 34. The very high rebound velocity of the punch serves to eject the slug of material from the punch end. The inertial of the slug causes it to detach itself from the punch element and continue downwardly.

Preferably, the driver button 49 is axially spaced from punch element 32, as shown in FIG. 2, so that the driver button strikes or impacts the punch element 32. Most preferably, this gap is chosen such that the driver button 49 hits the punch element 32 as maximum velocity of the driver button 49 is reached. The gap for the present design is on the order of 5 to 10 mils. In this way, the maximum kinetic energy is transferred to the punch element 32.

Figure 6:
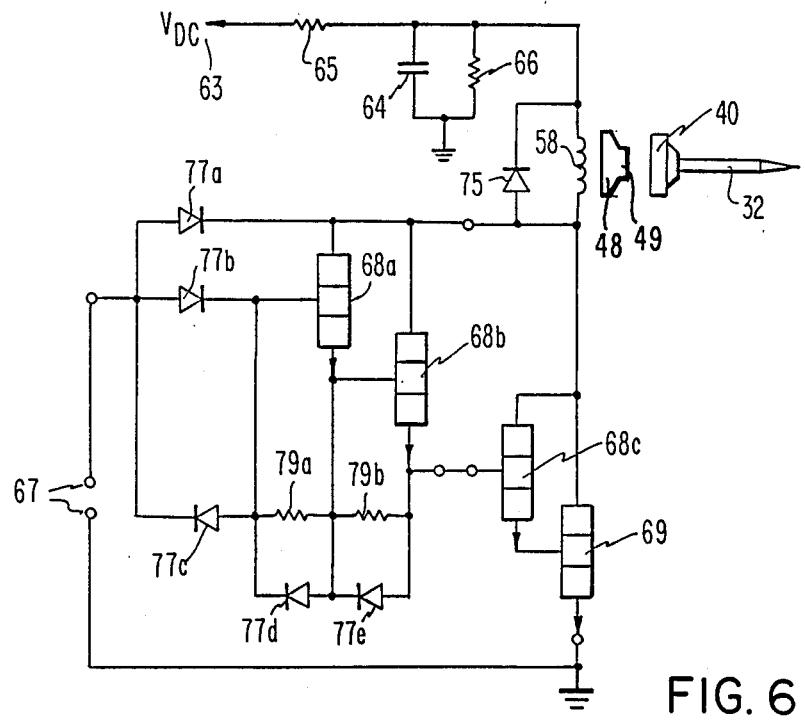
FIG. 6 is an electrical circuit diagram of a circuit that can be used to actuate the punching apparatus of the invention.

Referring now to FIG. 6 of the drawings, there is depicted a circuit suitable for actuating punch element 32 by applying a current pulse to coil 58. An external DC power supply 63 typically 100V, charges the main energy storage capacitor 64 through resistor 65. Resistor 66 is a bleeder resistor to discharge capacitor 64 and is provided for safety reasons. A positive input drive signal from the control is applied across terminals 67 when a punch stroke is called for. The pulse signal is amplified by transistors 68A, 68B, and 68C, to turn on transistor 69 in turn connected to ground. This effectively connects drive coil 58 to capacitor 64. The current in coil 58 gradually increases to produce a punch stroke. The maximum current in the coil is determined by the coil and circuit DC resistance. By applying a negative drive signal across terminals 67, transistors 68A, 68B, 68C and 69 are turned off and the coil 58 effectively disconnected from capacitor 64. Disconnecting coil 58 from capacitor 64 causes the current in coil 58 to decay by flowing through diode 75. Diodes 77A, 77B, 77C, 77D and 77E, and resistors 79A and 79B are included in the circuit to insure a fast turn on and turn off of the associated transistors.

In order to achieve the high velocity of the punch element, a very large pulse of electrical current must be passed through the coil 58. This requires that it be cooled, normally by liquid cooling.

Figure 7A:
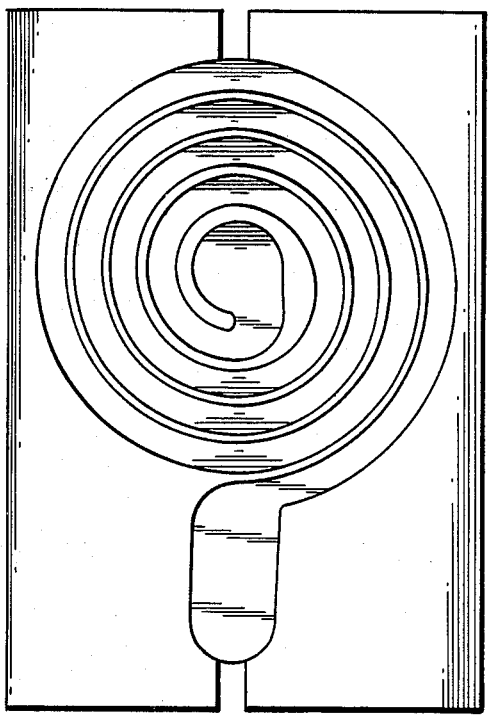
FIGS. 7A, 7B and 7C are views of the coil according to the invention.
Figure 7B:
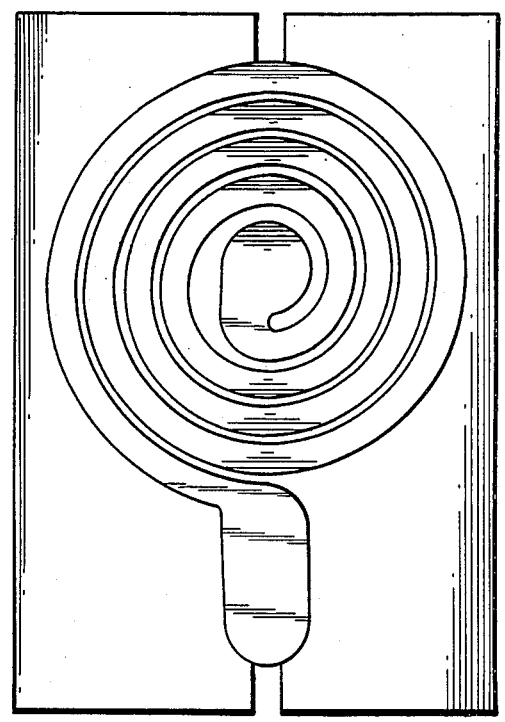
Figure 7C:
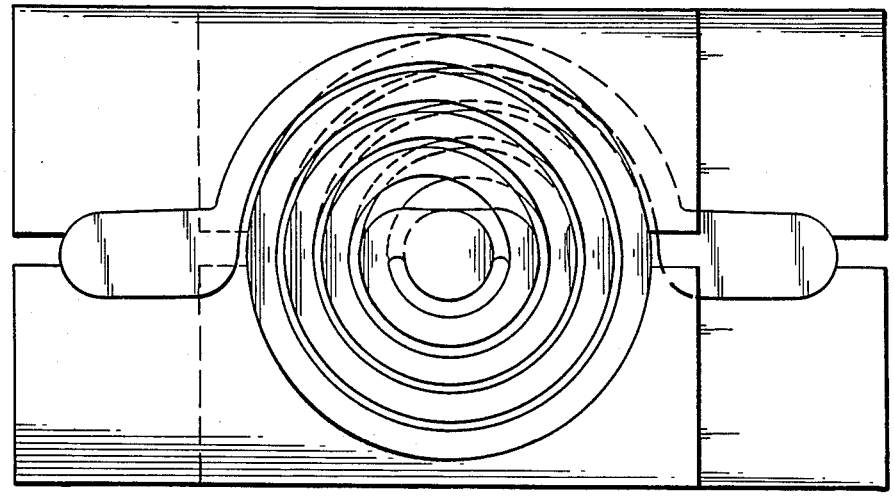

Referring now to FIGS. 7A, 7B and 7C, there is shown the coil of the present invention. FIGS. 7A and 7B show the separate parts of the coil and FIG. 7C shows the assembled coil. Each of the separate parts of the coil is generally planar and may be made by, for example, photoetching from flat copper or aluminum sheet. Once assembled, the coil is extremely compact and effective. One failure mode of wire wound coils is fatigue of leads and terminations. An advantage of the present invention, then, is that photoetching gradually increases conductor cross section toward the terminal, thereby reducing the incidence of fatigue failures.

In a preferred structure for passing cooling fluid through coil 58, the liquid is passed radially through the windings. The cooling liquid may be any cooling medium such as water, oil, cryogenic fluids, etc. As shown in FIG. 2, an inlet passage 74 introduces cooling liquid to the center of coil 58. The pressure forces the liquid radially through the windings where it is collected in liquid-cooled cavity 46 and exited out passage 78. Annular seals 80 are provided to prevent coolant leakage out of cavity 46.

Figure 3:
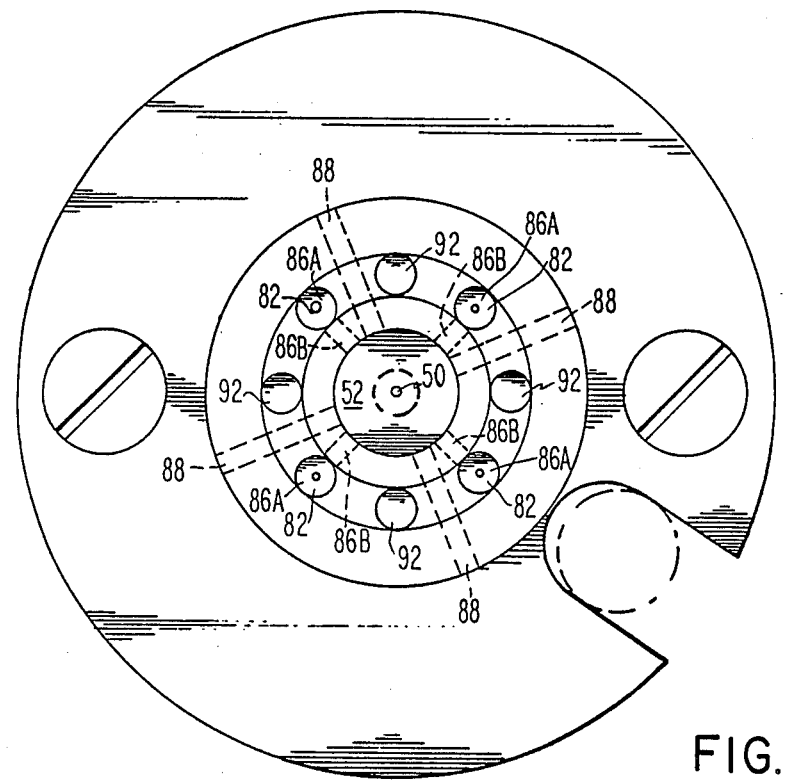
FIG. 3 is a top view taken on line 3—3 of FIG. 2.

In order to better support the workpiece sheet 54 over punch die 52, a plurality of air bearings 82 are provided around punch element 32, as indicated in FIG. 3. Each air bearing consists of air passages 84 and 86 with the ends thereof in aligned and opposed relation. Compressed air from the passages passed through bushings 84A and 86A respectively and are directed against opposite sides of workpiece sheet 54. A smaller branch air passage 86B connected to passage 86 directs air at the lower end of opening 50 in punch die 52 to assist in removing slugs of punched material from the punch element 32 upon completion of the punch stroke. Preferably a vacuum source is connected to chamber 56 to draw additional air through openings 88 to remove slugs of material and other debris.

An additional branch passage 84B in passage 84 is connected to chamber 90. By this arrangement, air is forced through opening 38 in bushing 34 and through the punch hole in sheet 54 following completion of the punch cycle. The air under pressure blows the slug of material that may have lodged in the die or sheet when the punch element was withdrawn.

In order to check for the presence or absence of punched holes in sheet 54, a plurality of hole sensors 92 are provided about the punch element 32 as indicated in FIGS. 2 and 3. The hole sensor 92 consists of a pair of fiber optic cables 93 and 94 with the ends arranged in opposed and aligned relation on opposite sides of sheet 54. One of the cables i.e. 94, is connected to a light source, and the other cable 93 connected to a light sensor. When a hole in sheet 54 is aligned with the ends of fiber optic cables 93 and 94, the light sensor will detect light, and indicate the presence of a hole. When no hole exists, the light is blocked by the sheet which is also detectable by the sensor. A suitable hole verifier control keeps track of the hole positions in the punch sheet and when the hole position are aligned with the ends of the detector. This allows the punch hole pattern to be checked simultaneously as the adjacent holes are being punched.

Referring now to FIGS. 9A and 9B, there is shown a presently used punch element and a punch element according to the invention, respectively. In FIG. 9A, punch element 32 comprises a unitary shaft 130 and tip 132 made from a wear resistant material such as cemented tungsten carbide. Shaft 13 is brazed to collar 40. Tip 132 is precision ground to the required dimensions. The process of grinding the tip is very time-consuming and expensive.

It would thus be desirable to have another method of manufacturing the punch element. Disclosed in FIG. 9B is such an alternative. The punch element 32' in FIG. 9B has a shaft 138 which is hollow at least at one end 140. The other end of the shaft is brazed to collar 40. Then, a segment of precision drawn steel wire 142 is inserted into the hollow end 140 of shaft 138. Thereafter, as best seen in FIG. 9C, the formation of the tip is completed by coating the wire 142 with a thin coating (about 5 microns) 144 of a wear resistant material such as titanium nitride, titanium carbide or thin diamond film.

Either of punch elements 32 or 32' would be suitable for punching holes of 8 mil diameter or less. However, for holes of 4 mil diameter or less, the punch element 32' would be preferred.

Figure 4:
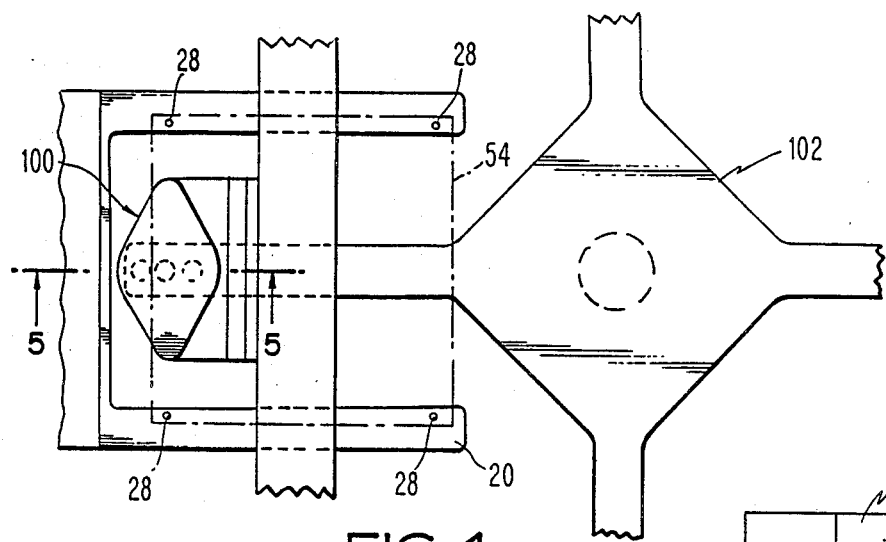
FIG. 4 is a detailed view in broken section that illustrates a rotatable head for supporting the punch element which is a preferred alternate specific embodiment of the invention.
Figure 5:
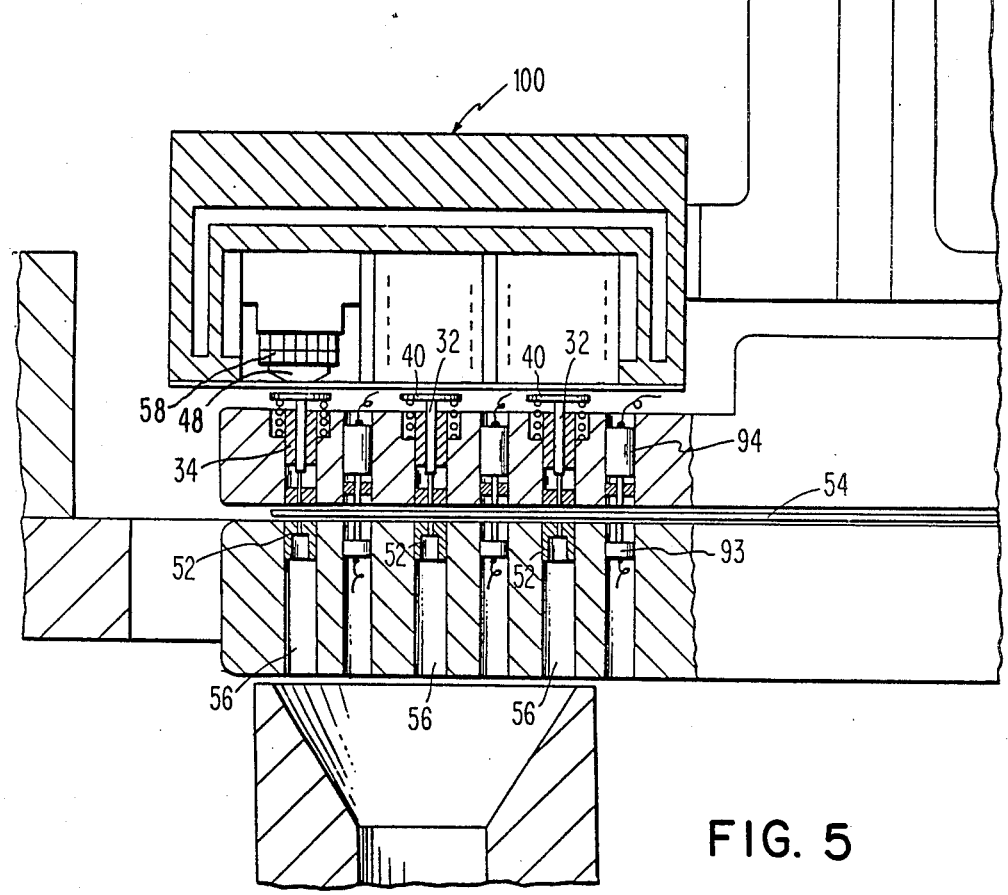
FIG. 5 is a sectional view taken on line 5—5 of FIG. 4.

In FIGS. 4 and 5 there is illustrated a modification of the original punch apparatus of the invention. In this embodiment the punch head 100 contains a plurality of punch elements 32, and the associated elements that make it operate. The multiple punch head is indexed over the sheet workpiece to punch holes as in the previously described punch apparatus. However, with multiple punches in the head, the number of holes that can be punched is greater. Another modification is mounting the punch head 100 on a spider 102 so that the head can be rotated into and out of punching position. The spider permits multiple heads to be mounted for instant use with the workpiece support apparatus. In operation, the punch must be serviced periodically to replace worn punches, etc. A serviced punch head can be held in reserve and rotated into operating position in the event of a malfunction of the head or the need of periodic servicing. This prevents a prolonged shut down of the apparatus. The spider element can be mounted for movement to shift the punch head over the workpiece surface.

The aforedescribed punch apparatus is particularly adapted to punch hole patterns in green ceramic in the production of multi layer ceramic substrates for semiconductor modules of the type described in U.S. Pat. No. 4,245,273, the disclosure of which is incorporated by reference herein. In such applications the diameter of the holes is very small, on the order of 5 to 6 mils, and is expected to be 4 mils or less for advanced substrates. The distance between holes varies but can be as close as 10 mils. The ceramic sheet thickness is normally from 8 to 11 mils. In operation, the hole pattern is controlled by a program. The rapidity of the punch stroke is such that the motion of the sheet need not be stopped during the punch stroke. The punch is engaged with the green sheet, i.e. when the punch enters and leaves the sheet for about $10^{-4}$ seconds. The sheet support means 20 moves about $10^{-4}$ inch during the time interval. This movement is accommodated by the plasticity of the green sheet and possibly a slight flexure of the punch.

Figure 8:
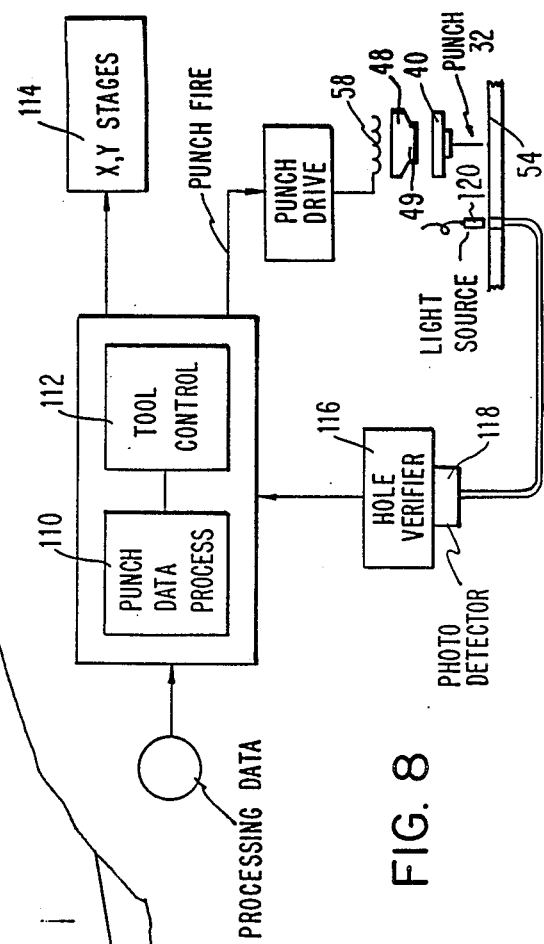
FIG. 8 is a schematic diagram of the control means for controlling the various elements of the punch apparatus of our invention.

Referring now to FIG. 8, there is depicted a schematic diagram of a control means that is part of the punch apparatus of the invention. Processing data, which includes the hole pattern configuration and the amount the pattern must be expanded to compensate for sintering shrinkage of the substrate is transformed into a matrix that is suitable for scanning in the X and Y directions in the punch data process unit 110. A list of hole coordinates is sent to tool control 112 as punch data. Tool control takes the X and Y hole coordinates and generates instructions for moving the X and Y stages 114 that support and move the workpiece sheet to be punched relative to the punch element 32. More specifically, control 112 coordinates the X movement of the table supporting the punch tool 14 and the Y stepping movement of carriage 22. The tool control 112 also generates firing signals for the coil 58 that are coordinated with the instructions for moving the X and Y stages. A punch hole verifier 116 coordinates signals from a photo detector with punch instructions and X and Y stage location data to verify that holes were punched and are clear of debris, etc. The verification, like the punch operation, is accomplished without stopping the continuous movement of the sheet relative to the punch element. The photo detector 118 is responsive to light from light source 120 that passes through a hole in sheet 54 and is conveyed through a fiber optic cable.

In addition, the quality of the holes punched in the green sheet by this apparatus is improved. The green ceramic material has visco elastic properties. When the punch speed is relatively slow it has a tendency to flow about the punch element during the downward punch stroke and subsequently cause sheet distortion. When the punch velocity is very high, as with this punch apparatus, the green sheet material reacts as if it were brittle material. This results in reduced sheet distortion.

While the invention has been illustrated and described with reference to ·preferred embodiments thereof, it is to be understood that the invention is not limited to the precise construction herein disclosed and the right is reserved to all changes and modifications coming within the scope of the invention as defined in the appended claims.

What is claimed is:

1. A punch apparatus for punching hole patterns in thin sheet material comprising;
   a housing having a liquid-cooled cavity therein, said cavity containing a liquid cooling medium;
   a coil mounted in said liquid-cooled cavity and immersed in said liquid medium;
   a driver disk made of a highly conductive material mounted in said liquid-cooled cavity and immersed in said liquid medium, said driver disk mounted adjacent to said coil;
   a driver button located outside of said liquid-cooled cavity but in communication with said driver disk;
   a punch element for perforating thin sheet material, said punch element aligned with said driver button;
   a means for energizing said coil with a pulse of electrical energy for generating flux linking said driver disk and said coil to repel said driver disk from said coil, thereby translating said driver button and said punch element, causing said punch element to perforate a thin sheet of material.

2. The punch apparatus of claim 1 wherein said coil is planar.

3. The punch apparatus of claim 1 further comprising:
   carriage means for positioning a thin sheet of material to be punched in the path of said punch element, and moving said sheet material in directions transverse to the axis of said punch element; and
   programmable means to selectively move said carriage means to specifically locate a thin sheet of material to the punched relative to said punch element, and to activate said means for energizing said coil to thereby produce a predetermined punched hole pattern in the thin sheet of material.

4. The punch apparatus of claim 3 wherein said carriage means moves said sheet material in a continuous movement as the punch element is actuated.

5. The punch apparatus of claim 1 which further includes a means to verify the integrity of the holes punched in the thin sheet of material.

6. The punch apparatus of claim 5 wherein said means to verify punched holes is comprised of a light source, a fiber optic cable from said light source to a first support means, a light sensor, a fiber optic cable from said light sensor to a second support means positioned in opposed relation to said first support means, the combination of elements capable of sensing the presence or absence of a hole in the thin sheet of material, said programmable means including a means to determine whether or not a hole should exist at given locations, and means to compare the output of said light sensor with the data in said means to determine hole locations.

7. The punch apparatus of claim 1 further comprising a plurality of punch elements, each of said punch elements being provided with a driver disk, a driver button, a planar coil and a means for energizing said coil.

8. The punch apparatus of claim 1 wherein the diameter of said punch element is less than 8 mils.

9. The punch apparatus of claim 1 wherein the diameter of said punch element is 4 mils or less.

10. The punch apparatus of claim 1 wherein said punch element comprises a hard, wear resistant coating.

11. The punch apparatus of claim 1 wherein said driver button is axially spaced from said punch element so that said driver button strikes said punch element.

12. The punch apparatus of claim 1 further comprising a resilient diaphragm positioned between said driver disk and said driver button but allowing communication therebetween, said resilient diaphragm defining an outer boundary of said liquid-cooled cavity.

13. The punch apparatus of claim 12 wherein said driver button is force fitted into said driver disk through an aperture in said resilient diaphragm.

14. The punch apparatus of claim 1 wherein said punch element punches a hole in the thin sheet of material in about 100 microseconds or less.

* * * * *